(12) United States Patent
Koizumi et al.

(10) Patent No.: US 8,111,954 B2
(45) Date of Patent: Feb. 7, 2012

(54) MODULE SUBSTRATE INCLUDING OPTICAL TRANSMISSION MECHANISM AND METHOD OF PRODUCING THE SAME

(75) Inventors: Naoyuki Koizumi, Nagano (JP); Kiyoshi Oi, Nagano (JP); Akihiko Tateiwa, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 205 days.

(21) Appl. No.: 12/408,820

(22) Filed: Mar. 23, 2009

(65) Prior Publication Data
US 2009/0245724 A1 Oct. 1, 2009

(30) Foreign Application Priority Data
Mar. 25, 2008 (JP) ................. P2008-077274

(51) Int. Cl.
G02B 6/12 (2006.01)
G02B 6/10 (2006.01)

(52) U.S. Cl. .................................. 385/14; 385/129

(58) Field of Classification Search .............. 385/14
See application file for complete search history.

(56) References Cited

U.S. PATENT DOCUMENTS

| | | | |
|---|---|---|---|
| 6,919,508 B2 * | 7/2005 | Forcier | 174/565 |
| 8,014,638 B2 * | 9/2011 | Nakano et al. | 385/14 |
| 2006/0018588 A1 * | 1/2006 | Uchida | 385/14 |
| 2007/0183718 A1 * | 8/2007 | Bae et al. | 385/47 |
| 2008/0044127 A1 * | 2/2008 | Leising et al. | 385/14 |
| 2011/0135248 A1 * | 6/2011 | Langer et al. | 385/14 |

FOREIGN PATENT DOCUMENTS

| | | | |
|---|---|---|---|
| EP | 1376180 A2 * | 1/2004 | |
| JP | 2004-86185 | 3/2004 | |
| JP | 2004086185 A * | 3/2004 | |
| JP | 2006-39045 | 2/2006 | |

* cited by examiner

Primary Examiner — Michelle R Connelly Cushwa
(74) Attorney, Agent, or Firm — Drinker Biddle & Reath LLP

(57) ABSTRACT

A module substrate is provided. The module substrate includes: a core portion; a build-up layer formed on the core portion and including a wiring pattern and an insulating layer; an optical transmission mechanism including: an optical transmission component including an optical waveguide, and a mounting portion on which a semiconductor element is to be mounted. The mounting portion is electrically connected to the optical transmission mechanism via the wiring pattern. The mounting portion includes a first mounting portion and a second mounting portion, and the optical transmission mechanism is disposed between the first mounting portion and the second mounting portion.

12 Claims, 5 Drawing Sheets

MODULE SUBSTRATE INCLUDING OPTICAL TRANSMISSION MECHANISM AND METHOD OF PRODUCING THE SAME

BACKGROUND OF THE INVENTION

1. Technical Field

The present disclosure relates to a module substrate including an optical transmission mechanism for signal transmission, and a method of producing the module substrate.

2. Related Art

In accordance with speeding up of information transmission, a method in which optical communication using an optical waveguide is employed in place of an electric signal has been studied. In the case where a signal is transmitted between a Central Processing Unit (CPU) and an Integrated Circuit (IC), in a conventional method in which transmission is performed using electric wiring, for example, a wiring delay in which the propagation speed of the signal is reduced depending on the length of the wiring, electromagnetic noises which are caused by the transmitted signal, and a delay of the signal propagation speed which is caused by impedance mismatching significantly appear when the transmission speed (frequency) of the signal is very high. Consequently, there arises a problem in that the process speed of an electronic device is restricted depending on the transmission speed of the signal.

By contrast, in a method using an optical waveguide in place of an electric wiring (i.e., a method using light in communication), the problems such as a signal delay, electromagnetic noise, and impedance mismatching are not occurred. Therefore, the method can be effectively used for increasing the signal transmission speed. As a method using light in signal transmission, for example, a method has been studied in which an optical waveguide is formed in a wiring substrate on which an IC is mounted, and, in addition to electrical signal transmission through an electric wiring, optical signal transmission using the optical waveguide is enabled (for example, see JP-A-2004-86185 and JP-A-2006-39045).

In the case where a signal transmission mechanism using an electric wiring, and that using light are to be provided in a wiring substrate, a signal transmission path using light must be placed so that a signal transmission path using the electric wiring is shortened as far as possible, thereby enabling signal transmission to be performed at higher speed. A signal transmission path using light has a structure which is different in kind from that of an electric wiring. Therefore, the electric wiring and the optical waveguide must be placed while they are surely combined with each other, and also it is requested to enable the mechanisms to be produced without complicating production steps.

SUMMARY OF THE INVENTION

Exemplary embodiments of the present invention address the above disadvantages and other disadvantages not described above. However, the present invention is not required to overcome the disadvantages described above, and thus, an exemplary embodiment of the present invention may not overcome any of the problems described above.

Accordingly, it is an aspect of the invention to provide a module substrate including an optical transmission mechanism. The optical transmission mechanism includes an optical waveguide, uses optical signal transmission to enable high-speed signal transmission, and can be produced without complicated production steps. Furthermore, it is another aspect of the invention to provide a method of producing the module substrate, and a semiconductor device which uses the module substrate including the optical transmission mechanism.

According to one or more aspects of the present invention, a module substrate is provided. The module substrate includes: a core portion; a build-up layer formed on the core portion and including a wiring pattern and an insulating layer; an optical transmission mechanism including: an optical transmission component including an optical waveguide, and a mounting portion on which a semiconductor element is to be mounted. The mounting portion is electrically connected to the optical transmission mechanism via the wiring pattern. The mounting portion includes a first mounting portion and a second mounting portion, and the optical transmission mechanism is disposed between the first mounting portion and the second mounting portion.

According to one or more aspects of the present invention, there is provided a method of manufacturing a module substrate including an optical transmission mechanism. The method includes: (a) forming an insulating layer on a supporting plate; (b) disposing an optical transmission component having an optical waveguide, and a conductive component, at given positions on the insulating layer; (c) covering the optical transmission component and the conductive component with a resin material, through resin molding, thereby forming a resin layer; (d) grinding an outer surface of the resin layer such that an end face of the conductive component is exposed, thereby forming a core portion which incorporates the optical transmission component, and a through electrode which penetrates the core portion in a thickness direction; (e) removing the supporting plate; (f) forming a first built-up layer including a first via and a first wiring pattern on a first surface of the core portion, wherein the first via and the first wiring pattern electrically connect the optical transmission component to a semiconductor element which is to be mounted on the first built-up layer; and (g) forming a second built-up layer including a second via and a second wiring pattern on a second surface of the core portion opposite to the first surface, wherein the second via and the second wiring pattern electrically connect the first built-up layer to an external connection terminal which is to be formed on the second built-up layer.

According the module substrate of the present invention, a signal is transmitted through the optical transmission mechanism and the wiring pattern is formed in the build-up substrate. Therefore, the optical transmission mechanism can be compactly placed in the module substrate, and the length of the wiring pattern which contributes signal transmission between the semiconductor elements can be shortened, whereby speeding up of the signal transmission can be attained. According to the method of producing the module substrate of the present invention, it is possible to produce easily and surely the module substrate including the optical transmission mechanism.

Other aspects and advantages of the present invention will be apparent from the following description, the drawings, and the claims.

DETAILED DESCRIPTION OF EXEMPLARY EMBODIMENT

Exemplary embodiments of the present invention will be now described with reference to the drawings hereinafter.

[Configuration of Module Substrate]

Figure 1:
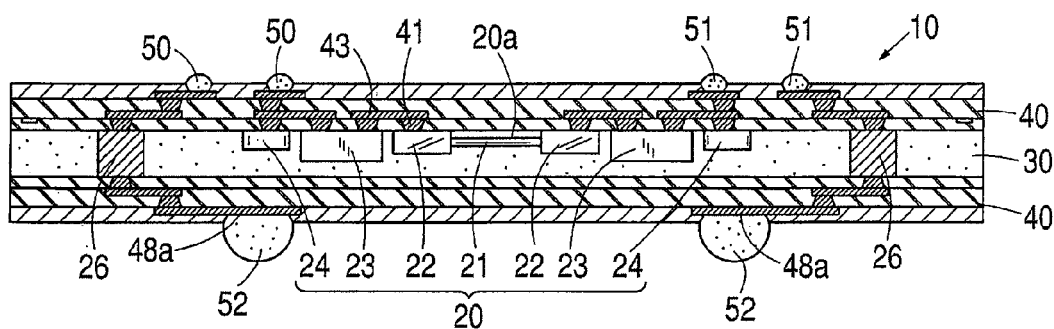
FIG. 1 is a cross-section view of a module substrate including an optical transmission mechanism.

FIG. 1 is a cross-section view showing the structure of the module substrate including an optical transmission mechanism according to an exemplary embodiment of the present invention. The module substrate 10 of the embodiment is configured by a core portion 30 which incorporates an optical transmission mechanism 20, and build-up layers 40 which are formed on the both surfaces of the core portion 30.

The optical transmission mechanism 20 which is incorporated in the core portion 30 includes an optical waveguide 21, light emitting/receiving elements 22 which are disposed at the both ends of the optical waveguide 21, respectively, driver components 23, and circuit components 24. The optical waveguide 21 and the light emitting/receiving elements 22 are used as a component in which optical transmission components including optical lenses are previously unitized and assembled together.

A photodiode can be used as a light receiving element, and a semiconductor laser element can be used as a light emitting element. The reason why the light emitting/receiving elements 22 are disposed at the both ends of the optical waveguide 21 is that a signal can be transmitted and received via the optical waveguide 21.

The driver components 23 are used for performing conversion of an optical signal to an electric signal and amplification of the electric signal. Since the driver components 23 are placed at the preceding and subsequent stages of the optical waveguide 21, the optical signal transmission can be surely performed. Electrical connections between the driver components 23 and the light emitting/receiving elements 22 are performed by vias 41 and wiring pattern 43 for electrical connection which are formed in one of the build-up layers 40.

The circuit components 24 are required for the optical transmission mechanism. The circuit components 24 are adequately used according to the product. Also electrical connections between the circuit components 24 and the driver components 23 are performed by the vias 41 and wiring pattern 43 which are formed in the build-up layer 40.

According to the module substrate of the exemplary embodiment, one surface of the substrate is used as a mounting surface for semiconductor elements, and the other surface is used as a mounted surface which is to be attached to a motherboard or the like. Therefore, bumps 50 to which the semiconductor elements are to be bonded are provided on the surface of the build-up layer 40 which is formed on the one surface side of the core portion 30. The bumps 50 are electrically connected to the wiring pattern through vias in an interlayer manner, and thus electrically connected to the optical transmission mechanism 20. FIG. 1 shows the configuration of a placement across the optical transmission mechanism 20. Specifically, the bumps 50 on which one semiconductor element is to be mounted are formed on one side of the optical transmission mechanism 20, and bumps 51 on which another semiconductor element is to be mounted are formed on the other side.

External connection terminals 52 for mounting are bonded to the other build-up layer 40. The external connection terminals 52 are formed by bonding connection members such as solder balls to connection pads 48a which are formed on the other build-up layer 40.

Electrical connections between the external connection terminals 52 and the semiconductor elements are performed via through electrodes 26 which pass through the core portion 30 in the thickness direction. In the build-up layer 40 which is formed on the core portion 30, vias and a wiring pattern are formed in an arrangement in which they are electrically connected to the through electrodes 26. Thus, electrical conductions between the external connection terminals 52 and the semiconductor elements are ensured.

[Semiconductor Device]

Figure 2:
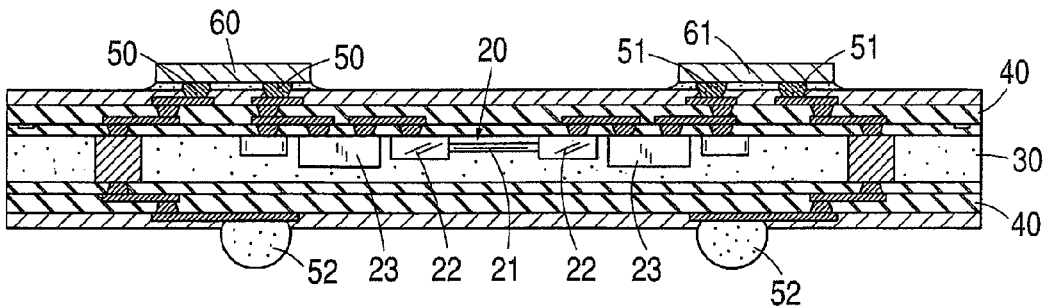
FIG. 2 is a section view of a semiconductor device in which semiconductor elements are mounted on the module substrate.

FIG. 2 shows a state where semiconductor elements 60, 61 are mounted on the module substrate 10 including the optical transmission mechanism shown in FIG. 1. In the illustrated example, the semiconductor elements 60, 61 are flip chip connected to the semiconductor-element mounting surface of the module substrate 10, and bonding portions between the semiconductor elements 60, 61 and the substrate are filled with underfill material.

As a method of mounting semiconductor elements on the module substrate, the wire bonding connection may be used instead of the flip-chip connection. In the case of the flip-chip connection, the wiring length is shorter than that in the case of the wire bonding connection, and therefore there is an advantage that the wiring delay hardly occurs.

Figure 3:
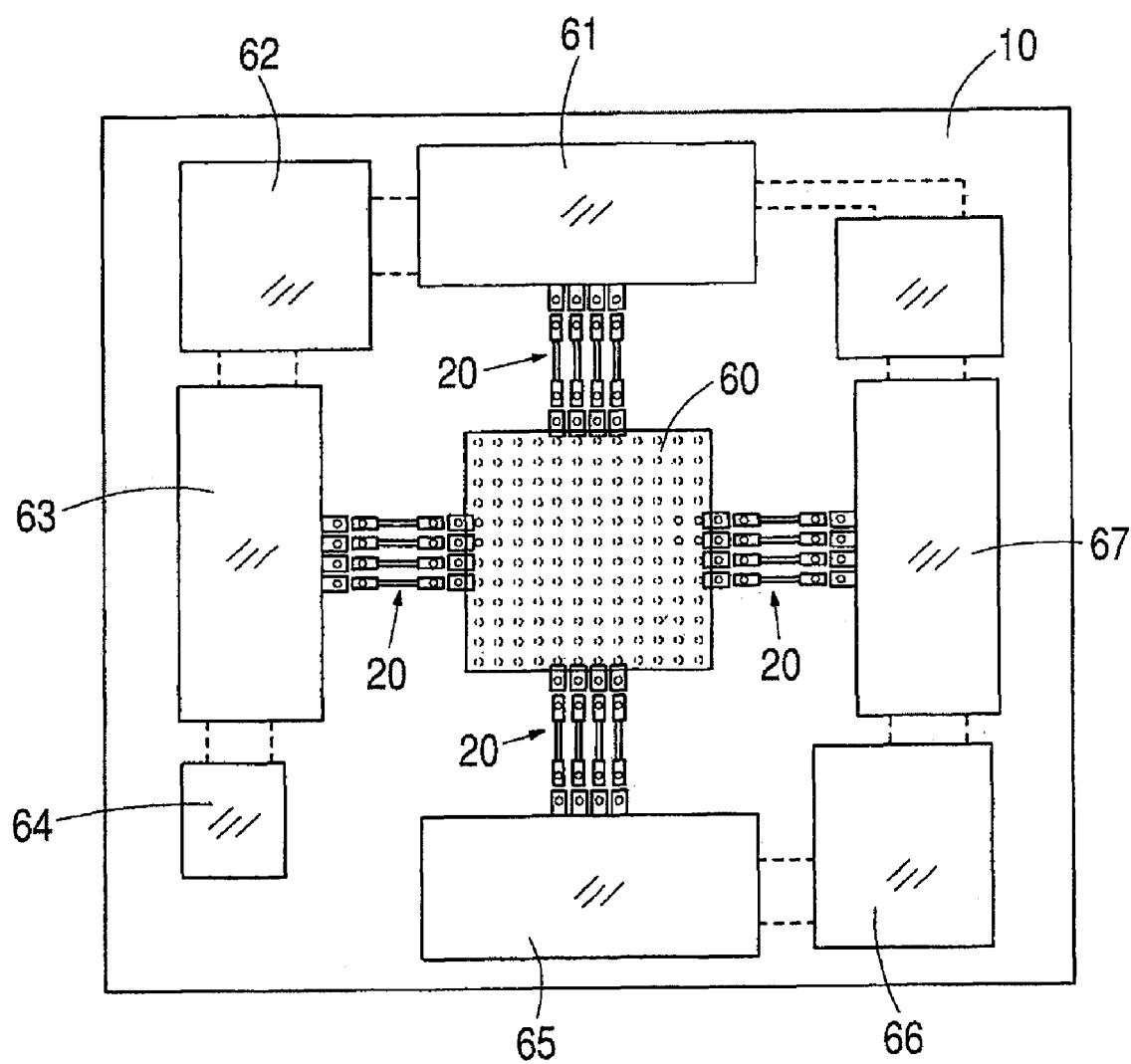
FIG. 3 is a plan view showing a state where the semiconductor elements are mounted on the module substrate.

FIG. 3 shows a top view in which semiconductor elements 60 to 67 are disposed on the module substrate 10. The semiconductor element 60 is a CPU, and electrically connected to the semiconductor elements 61, 63, 65, 67 via the optical transmission mechanisms 20. The semiconductor element 61 is electrically connected to the semiconductor element 62 via the wiring pattern formed in the build-up layer 40.

In the semiconductor device of the embodiment, the semiconductor element 60 is electrically connected to the semiconductor elements 61, 63, 65, 67 via the optical transmission mechanisms 20, and hence the transmission and reception of a signal can be performed at very high speed.

In the embodiment, particularly, the optical transmission mechanisms 20 is arranged in a linear manner between the semiconductor elements, and the wiring pattern which electrically connects the semiconductor elements to the optical transmission mechanisms 20 is arranged such that the connection is performed in the thickness direction of the build-up layer 40, whereby the length of the electrical wiring can be shortened as far as possible. According to the configuration, the transmission and reception of a signal can be performed at high speed while the delay due to the wiring length is made minimum.

The arrangement of the semiconductor elements in the module substrate 10 can be arbitrarily designed. In accordance with the arrangement of the semiconductor elements, the arrangement of the optical transmission mechanism 20 to be incorporated in the module substrate 10, and the wiring pattern to be formed in the build-up layer 40 can be designed. Since the module substrate 10 is provided as a substrate in which the optical transmission mechanisms 20 are incorporated, it is relatively easy to mount the semiconductor elements on the module substrate 10 to assemble the semiconductor device.

[Method of Producing Module Substrate]

FIGS. 4A to 5E show production steps of the module substrate including the optical transmission mechanism shown in FIG. 1.

FIGS. 4A to 4G show production steps through which the optical transmission mechanisms 20 are incorporated in the core portion 30.

Figure 4A:
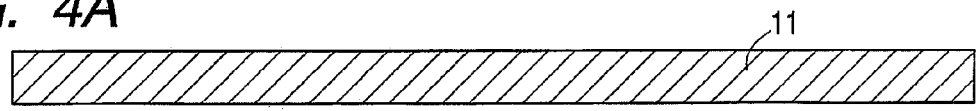
FIGS. 4A to 4G are cross-section views showing steps of producing the module substrate including an optical transmission mechanism.

FIG. 4A shows a supporting plate which is used as a supporting member when the core portion 30 is formed. The supporting plate 11 may be a plate-like member having high flatness, and its material is not particularly restricted. In the embodiment, a copper plate is used as the supporting plate 11, for example.

In the steps of producing the module substrate, a large substrate is used as a work substrate so that a plurality of module substrates are obtained from one work substrate. In FIGS. 4A to 5E, for convenience of description, a unit portion which is one module substrate of the work substrate is shown.

Figure 4B:

FIG. 4B shows a state where alignment marks 12 are formed on the surface of the supporting plate 11. The alignment marks 12 may be formed into a predetermined pattern by, for example, plating. In the production steps in the embodiment, the optical transmission components are mounted on the supporting plate 11, and the build-up layer is formed in the subsequent stages. The alignment marks 12 are disposed in order to perform correct alignment in these steps.

In the case where the alignment marks 12 are formed on a copper plate, a resist pattern is formed on the copper plate, and a metal which is visually distinguishable from the copper plate serving as a foundation layer, and which is not eroded by an etchant for etching the copper plate (for example, gold or nickel) is plated using the resist pattern as a mask.

Figure 4C:
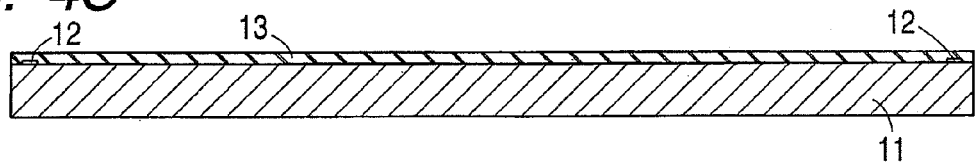

FIG. 4C shows a state where an insulating layer 13 is formed on one surface of the supporting plate 11, which is a step previous to the process of mounting the optical transmission components on the surface of the supporting plate 11. The insulating layer 13 can be formed by laminating, for example, a prepreg. The insulating layer 13 is formed into a state where certain adhesiveness is exhibited (the B-stage state).

Figure 4D:
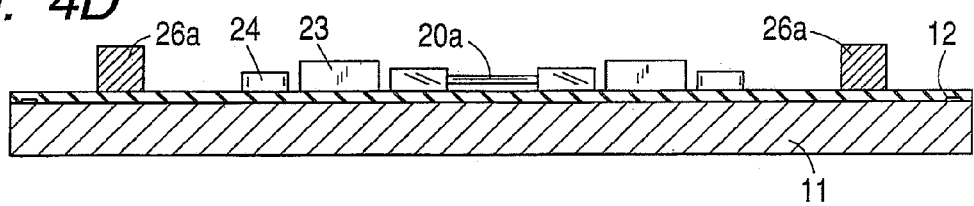

FIG. 4D shows a state where an optical transmission component 20a, the driver components 23, and the circuit components 24 are mounted on the surface of the insulating layer 13. A unit component in which the optical waveguide 21, the light emitting/receiving elements 22, and lenses are combined together is preferably used as the optical transmission component 20a.

The optical transmission component 20a, the driver components 23, and the circuit components 24 are accurately arranged at respective given positions while using the alignment marks 12 as reference positions.

In addition to the components of the optical transmission mechanism 20, conductive components 26a which are used as through electrodes for electrically connecting together the build-up layers 40 formed on the both surfaces of the core portion 30 are positioned and placed. The conductive components 26a are formed into a columnar shape, and placed on the insulating layer 13 while standing thereon.

After the components are placed on the surface of the insulating layer 13, the assembly undergoes a heating and curing step, whereby the insulating layer 13 is cured.

Figure 4E:
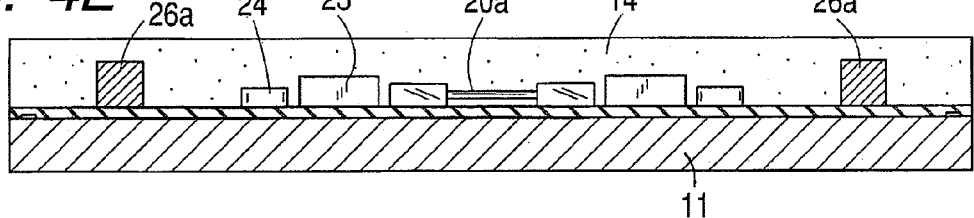

FIG. 4E shows a state where the component mounting surface of the supporting plate 11 is molded with a resin 14 by using a resin molding apparatus so as to bury the optical transmission component 20a, the driver components 23, the circuit components 24, and the conductive components 26a in the resin 14. An epoxy thermosetting resin may be used as the molding resin 14. The filler content in the resin is about 20% to 95%. When the resin molding is performed using a resin molding apparatus, the components such as the optical transmission component 20a can be surely sealed, and the core portion 30 having a given strength and shape retention can be obtained.

Figure 4F:
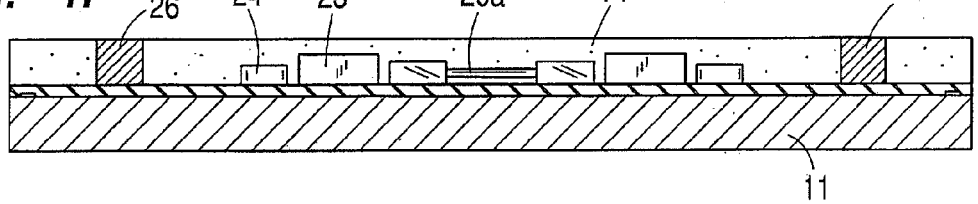

FIG. 4F shows a step of grinding the surface of the resin 14 after the resin molding step to expose end faces of the conductive components 26a from the surface of the resin 14. The grinding process is stopped at a position where the end faces of the conductive components 26a are exposed from the surface of the resin 14. As a result, the surface of the resin 14 is processed to be flat, and the conductive components 26a are formed as the through electrodes 26 which pass through the resin portion of the core portion 30 in the thickness direction.

Figure 4G:
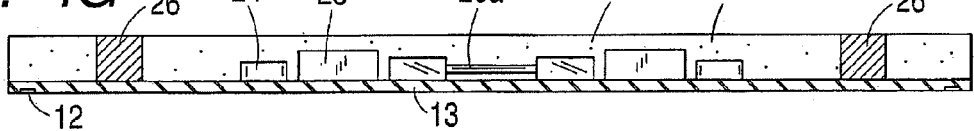

FIG. 4G shows a state where the supporting plate 11 is etched away. When the supporting plate 11 is etched away, a laminated body is obtained in which the core portion 30 is covered with the insulating layer 13, the optical transmission component 20a, the driver components 23, and the circuit components 24 are buried and sealed in the core portion 30, and the through electrodes 26 passing through the core portion 30 in the thickness direction are disposed.

In the case where the etchant which etches the supporting plate 11 is an etchant that does not erode the alignment marks 12, the alignment marks 12 remain on the insulating layer 13, and can be used as alignment marks in build-up steps.

FIGS. 5A to 5E show steps of forming the build-up layers 40 on the both surfaces of the core portion 30 by stacking.

Figure 5A:
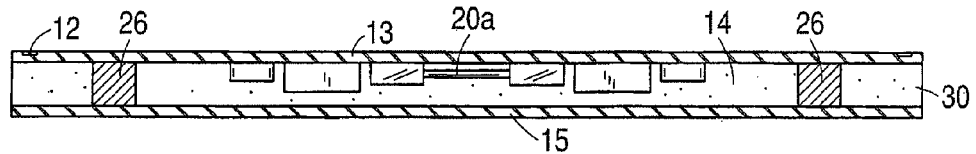
FIGS. 5A to 5E are cross-section views showing steps of producing the module substrate including an optical transmission mechanism.

FIG. 5A shows a state where an insulating layer 15 having electrically insulative property is formed on the surface of the core portion 30 which is opposite to the surface that is covered by the insulating layer 13. Similarly to the insulating layer 13, the insulating layer 15 is formed by laminating, for example, a prepreg.

Figure 5B:
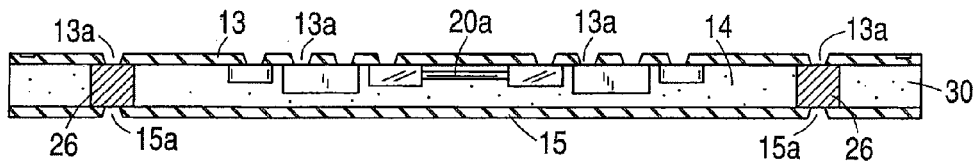

FIG. 5B shows a state where via holes 13a, 15a are formed in the insulating layers 13, 15 by laser processing. The via holes 13a, 15a are formed such that they are positioned in alignment with the positions of connection electrodes of the optical transmission component 20a, the driver components 23, and the circuit components 24, and the both end faces of the through electrodes 26. In the laser processing of the via holes 13a, 15a, when the via holes are formed using the alignment marks 12 as reference positions, the via holes can be correctly formed.

Figure 5C:
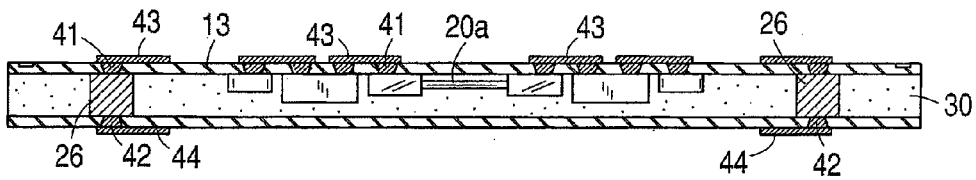

FIG. 5C shows a state where vias 41, 42 and wiring patterns 43, 44 are formed in the insulating layers 13, 15. The vias 41, 42 and the wiring patterns 43, 44 can be formed by the semi-additive method or the like.

In the case of the semi-additive method, the vias 41, 42 and the wiring patterns 43, 44 are formed as follows. Firstly, the via holes 13a, 15a are formed in the insulating layers 13, 15, and plating seed layers are formed by electroless copper plating or the like. Then, resist patterns are formed on the plating seed layers in accordance with the wiring patterns 43, 44, and conductive portions (plating conductors) are formed which serve as the vias 41, 42 and the wiring patterns 43, 44, by electrolytic plating using the plating seed layers as feeding layers. Finally, the resist patterns are removed and portions of the plating seed layers which are exposed from the outer surfaces are selectively etched away.

Figure 5D:
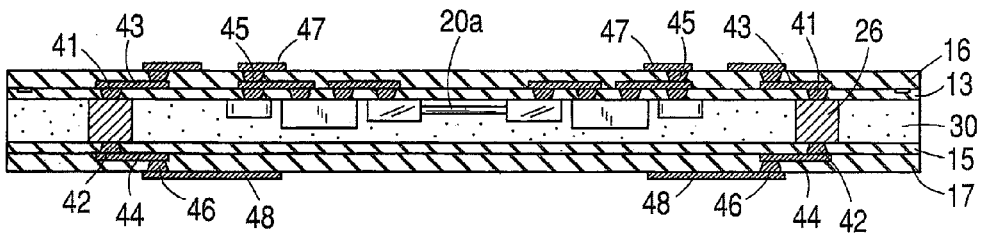

FIG. 5D shows a state where insulating layers 16, 17 are formed on the insulating layers 13, 15, respectively, and vias 45, 46 and wiring patterns 47, 48 are formed in the insulating layers 16, 17, respectively. The insulating layers 16, 17 can be formed by laminating a prepreg, and the vias 45, 46 and the wiring patterns 47, 48 can be formed by the above-described semi-additive method. In this way, the insulating layers are sequentially formed, and the wiring layers are formed to be electrically connected to each other in the layers (the build-up method), whereby an arbitrary number of wiring layers can be formed.

Figure 5E:
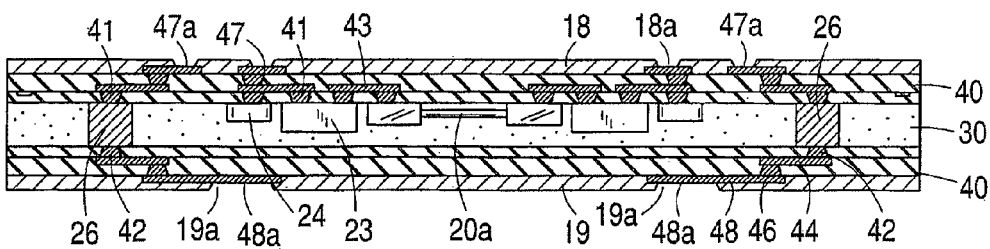

FIG. 5E shows a state where the surfaces of the wiring layers formed by the build-up method are covered by solder resist layers serving as protective films 18, 19, and opening portions 18a, 19a are formed in the protective films 18, 19. The opening portions 18a are formed in alignment with positions where electrodes of the semiconductor elements are to be bonded, and the opening portions 19a are formed in alignment with positions where the external connection terminals are to be bonded. In the opening portions 18a, 19a, pads 47a, 48a are exposed, respectively. Next, solder paste is provided to the pads 47a, and the bumps 50 are formed by solder reflow. Solder balls are bonded to the pads 48a to form the external connection terminals 52 (see FIG. 1).

After the bumps 50 and the external connection terminals 52 are formed, the large work substrate is cut into individual pieces so as to obtain the module substrate including an optical transmission mechanism. The external connection terminals 52 may be bonded to the pads 48a after the work substrate is cut into individual pieces.

[Other Configuration Examples of Module Substrate]

Figure 6:
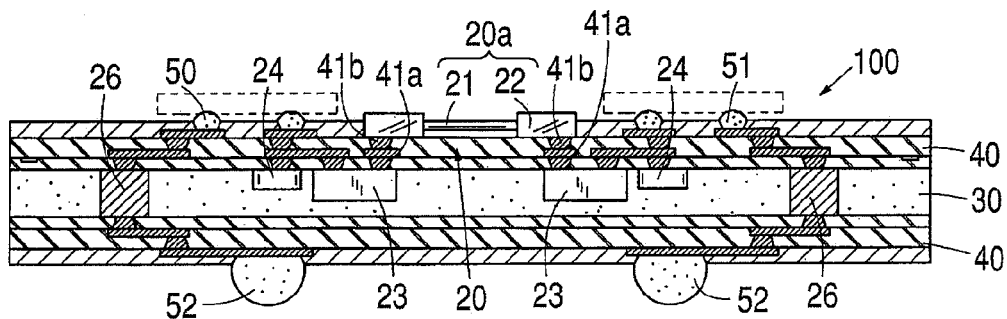
FIG. 6 is a cross-section view showing another configuration of the module substrate including an optical transmission mechanism.

FIG. 6 is a cross-section view showing another configuration example of the module substrate including an optical transmission mechanism. According to the module substrate 100 of the embodiment, the optical transmission component 20a including the optical waveguide 21 and the light emitting/receiving elements 22 is placed on the outer surface of the module substrate.

In the module substrate 100, the driver components 23, the circuit components 24, and the through electrodes 26 are incorporated in the core portion 30. Electrical connections between the driver components 23 and the light emitting/receiving elements 22 are performed by vias 41a, 41b which are formed in one of the build-up layers 40.

The end faces of the vias 41b are exposed from the surface of the build-up layer 40, and the connection electrodes of the light emitting/receiving elements 22 of the optical transmission component 20a are bonded to the end faces of the vias 41b, respectively. Thus, electrical connections between the optical transmission component 20a and the driver components 23 are performed.

The method of incorporating the driver components 23 and the circuit components 24 into the core portion 30, and forming the vias 41a, 41b in the build-up layers 40 is performed in the same production steps as described above.

According to the configuration of the module substrate 100 of the embodiment, after the core portion 30 and the build-up layer 40 are formed, the optical transmission component 20a can be mounted on the substrate to assemble the module substrate. In the case where the optical transmission component 20a is provided as a unit product, the module substrate 100 of the embodiment is useful as a module substrate which can be easily assembled.

Figure 7:
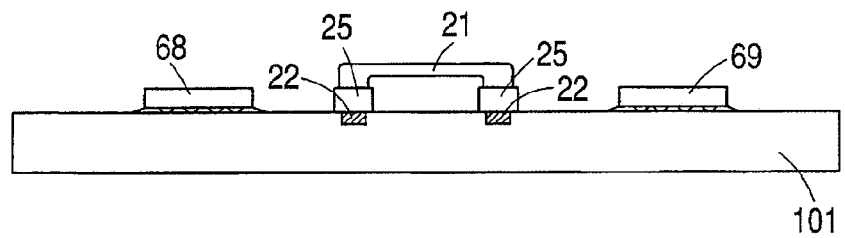
FIG. 7 is a side view showing another configuration of the semiconductor device in which semiconductor elements are mounted on the module substrate.

A module substrate 101 shown in FIG. 7 is a modification of the module substrate 100 shown in FIG. 6. In the module substrate 101 of the embodiment, the light emitting/receiving elements 22 are incorporated in the substrate, connectors 25 are placed on the surface of the substrate, and the optical waveguide 21 is detachable by means of the connectors 25.

In a similar manner as the above-described embodiment, the optical waveguide 21 is placed outside the module substrate 101, whereby the process of producing the substrate can be simplified. Even in the case where the optical waveguide 21 and the like are made of a resin, the configuration where the optical waveguide 21 is attached after semiconductor elements 68, 69 are mounted on the substrate by reflow enables the optical waveguide 21 to be mounted without a thermal history.

Figure 8:
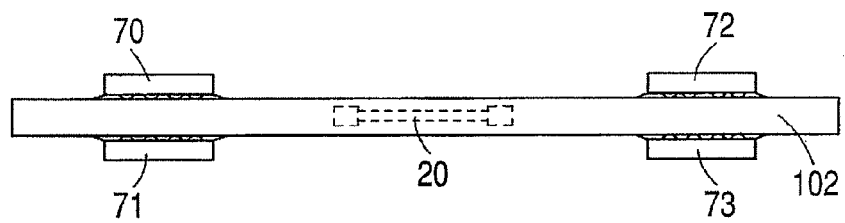
FIG. 8 is a side view showing a further configuration of the semiconductor device in which semiconductor elements are mounted on the module substrate.

FIG. 8 shows an example of a semiconductor device in which semiconductor elements 70 to 73 are mounted on the both surfaces of a module substrate 102 incorporating the optical transmission mechanism 20. The configuration where the optical transmission mechanism 20 is placed in the substrate is similar to that of the above-described embodiment. The semiconductor elements mounted on the both surfaces of the substrate are electrically connected to each other via the through electrodes 26 formed in the core portion.

Figure 9:
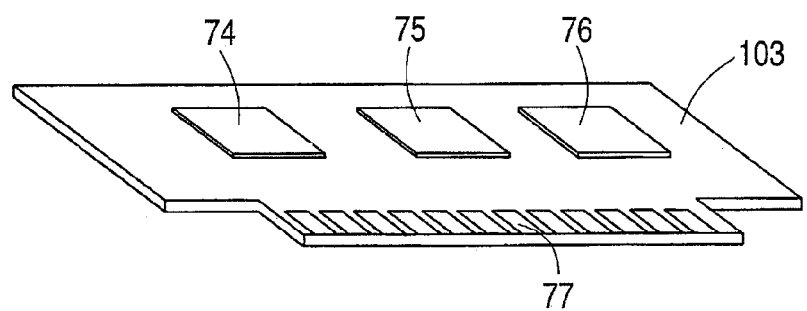
FIG. 9 is a perspective view showing a still further configuration of the semiconductor device in which semiconductor elements are mounted on the module substrate.

FIG. 9 shows an example of a semiconductor device in which semiconductor elements 74, 75, 76 are mounted on a module substrate 103 in which the optical transmission mechanism 20 is incorporated and terminals 77 are formed in one side edge of the substrate.

As shown in these embodiments, the module substrate of the invention is not restricted to the configuration where one surface of the substrate is formed as a mounting surface for semiconductor elements, and the other surface is formed as a mounted surface to which external connection terminals are bonded. Semiconductor elements may be mounted on the both surfaces of the substrate, or a configuration where mounting terminals are disposed in one edge of the substrate can be formed.

In the case where a semiconductor element having high-heat value such as a CPU is mounted on the substrate, or the case where, during operation, the optical transmission mechanism generates heat, heat radiating fins or a Peltier element for cooling may be attached to the semiconductor element or the module substrate so that, during operation, the module substrate is not excessively heated.

While the present invention has been shown and described with reference to certain exemplary embodiments thereof, it will be understood by those skilled in the art that various changes in form and details may be made therein without departing from the spirit and scope of the invention as defined by the appended claims. It is aimed, therefore, to cover in the appended claim all such changes and modifications as fall within the true spirit and scope of the present invention.

What is claimed is:

1. A module substrate comprising:
   a single layer core portion formed of the same material;
   a build-up layer formed on the single layer core portion and comprising a wiring pattern and an insulating layer;
   a driver component embedded in the single layer core portion;
   an optical transmission component including an optical waveguide disposed between a light-emitting element and a light receiving element, the optical waveguide being a different member than the core portion, the optical waveguide, light-emitting element and light receiving element being embedded in the single layer core portion, the optical transmission component being electrically connected to the driver component which is a different component than the optical transmission component;
a mounting portion provided on an outermost layer of the build-up layer on which a semiconductor element is to be mounted, the mounting portion being electrically connected to the optical transmission component via the wiring pattern, wherein the mounting portion comprises a first mounting portion and a second mounting portion, and the optical transmission component is disposed between the first mounting portion and the second mounting portion; and
a columnar shaped electrode extending through the core portion and electrically connecting the build-up layer.

2. The module substrate according to claim 1, wherein the build-up layer further comprises a via electrically connected to the wiring pattern, and the via and the wiring pattern electrically connect the optical transmission component to the mounting portion.

3. The module substrate according to claim 1, wherein the single layer core portion is formed of resin material.

4. The module substrate according to claim 1, wherein the optical transmission component is disposed on the built-up layer.

5. The module substrate according to claim 1, wherein the optical transmission component further comprises:
a circuit component which is electrically connected to the optical transmission component.

6. The module substrate according to claim 1, wherein the build-up layer comprises a first built-up layer and a second built-up layer,
wherein the first built-up layer is formed on a first surface of the single layer core portion, the second built-up layer is formed on a second surface of the single layer core portion opposite to the first surface, and
the electrode extending through the core portion electrically connects the first built-up layer and the second built-up layer.

7. The module substrate according to claim 6, wherein the first built-up layer is a mounting surface on which the semiconductor element is to be mounted, and the second built-up layer is a mounted surface to which an external connection terminal is bonded.

8. The module substrate according to claim 6, wherein the first and second built-up layers are mounting surfaces on which the semiconductor element is to be mounted.

9. The module substrate according to claim 1, wherein
the light emitting element, the light receiving element and the driver component are arranged at one surface side of the single layer core portion,
the light emitting element, the light receiving element and the driver component are flush with the surface of the single layer core portion, and
the light emitting element and the light receiving element are electrically connected to the driver component through the wiring pattern of the build-up layer formed on the surface of the single layer core portion.

10. A semiconductor device comprising:
a module substrate; and
a plurality of semiconductor elements mounted on the module substrate, wherein
the module substrate comprises:
a single layer core portion formed of the same material;
a build-up layer formed on the single layer core portion and comprising wiring patterns and insulating layers;
a plurality of driver components embedded in the single layer core portion;
a plurality of optical transmission components each including an optical waveguide disposed between a light-emitting element and a light receiving element, the optical waveguide being a different member than the core portion, the optical waveguide, light-emitting element and light receiving element being embedded in the single layer core portion, each optical transmission component being electrically connected to a respective driver component which is a different component than the optical transmission component;
a plurality of mounting portions on which the semiconductor elements are to be mounted, the mounting portions being electrically connected to respective optical transmission components via the wiring patterns, wherein the mounting portions comprise a plurality of first mounting portions and a plurality of second mounting portions, and each of the optical transmission components is disposed between a corresponding one of the first mounting portions and a corresponding one of the second mounting portions; and
a columnar shaped electrode extending through the core portion and electrically connecting the build-up layer.

11. A method of manufacturing a module substrate including, a first mounting portion on which a first semiconductor element is to be mounted, a second mounting portion on which a second semiconductor element is to be mounted, and an optical transmission component disposed between the first mounting portion and the second mounting portion, the method comprising:
(a) forming an insulating layer on a supporting plate;
(b) disposing the optical transmission component having an optical waveguide disposed between a light-emitting element and a light receiving element, a driver component, and a columnar shaped electrode, at given positions on the insulating layer, the optical transmission component being electrically connected to the driver component which is a different component than the optical transmission component;
(c) covering the optical transmission component including the optical waveguide and the light-emitting element and the light receiving element, the driver component, and the columnar shaped electrode with a resin material, through resin molding, thereby forming a resin layer, the optical waveguide being a different member than the resin layer;
(d) grinding an outer surface of the resin layer such that an end face of the columnar shaped electrode is exposed, thereby forming a single layer core portion formed of the same resin material which incorporates the optical transmission component including the optical waveguide and the light-emitting element and the light receiving element, and the driver component, and the columnar shaped electrode which penetrates the single layer core portion in a thickness direction;
(e) removing the supporting plate;
(f) forming a first built-up layer including a first via and a first wiring pattern on a first surface of the single layer core portion, wherein the first via and the first wiring pattern electrically connect the optical transmission component to the first semiconductor element which is to be mounted on the first built-up layer; and
(g) forming a second built-up layer including a second via and a second wiring pattern on a second surface of the single layer core portion opposite to the first surface, wherein the second via and the second wiring pattern electrically connect the first built-up layer to an external connection terminal which is to be formed on the second built-up layer; and (h) electrically connecting the first built-up layer to the second build-up layer with the columnar shaped electrode.

12. A module substrate comprising:

a single layer core portion formed of the same material;

a build-up layer formed on the single layer core portion and comprising a wiring pattern and an insulating layer;

an optical transmission component including an optical waveguide disposed between a light-emitting element and a light receiving element, the optical waveguide being a different member than the core portion, the optical waveguide, light-emitting element and light receiving element being embedded in the single layer core portion, and a mounting portion on which a semiconductor element is to be mounted, the mounting portion being electrically connected to the optical transmission component via the wiring pattern, wherein the mounting portion comprises a first mounting portion and a second mounting portion, and the optical transmission component is disposed between the first mounting portion and the second mounting portion, wherein the build-up layer comprises a first built-up layer and a second built-up layer, wherein the first built-up layer is formed on a first surface of the single layer core portion, the second built-up layer is formed on a second surface of the single layer core portion opposite to the first surface, and wherein a columnar shaped electrode extends through the core portion and electrically connects the first built-up layer and the second built-up layer.

* * * * *